United States Patent
Carns et al.

(10) Patent No.: US 8,324,069 B1
(45) Date of Patent: *Dec. 4, 2012

(54) METHOD OF FABRICATING HIGH-PERFORMANCE CAPACITORS IN INTEGRATED MOS TECHNOLOGIES

(75) Inventors: Timothy K. Carns, Meridian, ID (US); John L. Horvath, Boise, ID (US); Lee J. DeBruler, Caldwell, ID (US); Michael J. Westphal, Boise, ID (US)

(73) Assignee: IXYS CH GmbH (CH)

( * ) Notice: Subject to any disclaimer, the term of this patent is extended or adjusted under 35 U.S.C. 154(b) by 0 days.

This patent is subject to a terminal disclaimer.

(21) Appl. No.: 13/134,159

(22) Filed: May 31, 2011

Related U.S. Application Data

(63) Continuation of application No. 12/804,414, filed on Jul. 20, 2010, now Pat. No. 8,017,475, which is a continuation of application No. 11/289,262, filed on Nov. 29, 2005, now Pat. No. 7,768,052, which is a continuation of application No. 09/351,544, filed on Jul. 12, 1999, now Pat. No. 7,060,584.

(51) Int. Cl.
*H01L 21/20* (2006.01)
(52) U.S. Cl. ........ 438/397; 438/254; 438/381; 438/739; 257/E21.008; 257/307
(58) Field of Classification Search .......... 257/307, 257/309, 437, E21.008; 438/250, 253, 254, 438/239, 241, 381, 354, 393, 396, 397, 387, 438/388, 655, 656, 739; 361/303, 306.3
See application file for complete search history.

(56) References Cited

U.S. PATENT DOCUMENTS

| | | | |
|---|---|---|---|
| 4,240,196 A | 12/1980 | Jacobs et al. | 438/593 |
| 5,005,103 A | 4/1991 | Kwon et al. | 361/313 |

(Continued)

FOREIGN PATENT DOCUMENTS

| | | |
|---|---|---|
| JP | 05143643 | 6/1993 |

(Continued)

OTHER PUBLICATIONS

Bencher et al., "Dielectric Antireflective Coatings for DUV Lithography", Solid State Technology, Mar. 1997, vol. 40, issue 3, 5 pages.

*Primary Examiner* — Chris Chu
(74) *Attorney, Agent, or Firm* — Imperium Patent Works; Darien K. Wallace

(57) ABSTRACT

A method of fabricating a high-performance capacitor that may be incorporated into a standard CMOS fabrication process suitable for submicron devices is described. The parameters used in the standard CMOS process may be maintained, particularly for the definition and etch of the lower electrode layer. To reduce variation in critical dimension width, an Anti-Reflective Layer (ARL) is used, such as a Plasma Enhanced chemical vapor deposition Anti-Reflective Layer (PEARL) or other Anti-Reflective Coatings (ARCS), such as a conductive film like TiN. This ARL formation occurs after the capacitor specific process steps, but prior to the masking used for defining the lower electrodes. A Rapid Thermal Oxidation (RTO) is performed subsequent to removing the unwanted capacitor dielectric layer from the transistor poly outside of the capacitor regions, but prior to the PEARL deposition. Another embodiment instead eliminates the capacitor dielectric removal step, which is then replaced by a step to form an additional layer that is later etched away to leave spacers on the capacitor sides, thereby eliminating any undercutting of the dielectric.

17 Claims, 6 Drawing Sheets

U.S. PATENT DOCUMENTS

| | | | |
|---|---|---|---|
| 5,068,697 A | 11/1991 | Noda et al. | 438/3 |
| 5,356,826 A | 10/1994 | Natsume | 438/238 |
| 5,371,700 A | 12/1994 | Hamada | 365/149 |
| 5,374,578 A | 12/1994 | Patel et al. | 438/3 |
| 5,397,729 A | 3/1995 | Kayanuma et al. | 438/384 |
| 5,447,879 A | 9/1995 | Park | 438/155 |
| 5,452,178 A | 9/1995 | Emesh et al. | 361/303 |
| 5,470,775 A | 11/1995 | Nariani | 438/384 |
| 5,482,894 A | 1/1996 | Havemann | 438/623 |
| 5,545,585 A | 8/1996 | Wang et al. | 438/397 |
| 5,618,749 A | 4/1997 | Takahashi et al. | 438/384 |
| 5,652,171 A * | 7/1997 | Nagano et al. | 438/3 |
| 5,683,931 A | 11/1997 | Takahashi | 438/253 |
| 5,728,619 A | 3/1998 | Tsai et al. | 438/297 |
| 5,747,879 A | 5/1998 | Rastogi et al. | 257/751 |
| 5,918,119 A | 6/1999 | Huang | 438/238 |
| 5,918,147 A | 6/1999 | Filipiak et al. | 438/636 |
| 5,929,473 A | 7/1999 | Nishihori et al. | 257/277 |
| 5,986,318 A | 11/1999 | Kim et al. | 257/437 |
| 5,989,956 A * | 11/1999 | Huang | 438/254 |
| 6,037,218 A | 3/2000 | Dennison et al. | 438/254 |
| 6,083,804 A | 7/2000 | Chuang | 438/396 |
| 6,090,656 A | 7/2000 | Randazzo | 438/239 |
| 6,107,136 A | 8/2000 | Melnick et al. | 438/253 |
| 6,144,060 A | 11/2000 | Park et al. | 257/310 |
| 6,200,846 B1 | 3/2001 | Watanabe | 438/239 |
| 6,208,033 B1 | 3/2001 | Doan et al. | 257/770 |
| 6,306,721 B1 * | 10/2001 | Teo et al. | 438/396 |
| 6,323,079 B1 * | 11/2001 | Takeshita | 438/238 |
| 6,323,513 B1 * | 11/2001 | Schindler et al. | 257/296 |
| 6,420,272 B1 * | 7/2002 | Shen et al. | 438/702 |
| 6,430,028 B1 * | 8/2002 | Kar-Roy et al. | 361/306.3 |
| 6,440,858 B1 | 8/2002 | Canale et al. | 438/700 |
| 7,060,584 B1 * | 6/2006 | Carns et al. | 438/354 |

FOREIGN PATENT DOCUMENTS

| | | |
|---|---|---|
| JP | 07185758 | 7/1995 |
| JP | 08076940 | 3/1996 |
| JP | 08155316 | 6/1996 |
| JP | 411307722 A | 4/1998 |

* cited by examiner

METHOD OF FABRICATING HIGH-PERFORMANCE CAPACITORS IN INTEGRATED MOS TECHNOLOGIES

CROSS REFERENCE TO RELATED APPLICATION

This application is a continuation of, and claims priority under 35 U.S.C. §120 from, nonprovisional U.S. patent application Ser. No. 12/804,414 entitled "Process to Improve High-Performance Capacitors in Integrated MOS Technologies," filed on Jul. 20, 2010, now U.S. Pat. No. 8,017,475. Application Ser. No. 12/804,414 in turn is a continuation of, and claims priority under 35 U.S.C. §120 from, nonprovisional U.S. patent application Ser. No. 11/289,262 entitled "Process to Improve High-Performance Capacitors in Integrated MOS Technologies," filed on Nov. 29, 2005, now U.S. Pat. No. 7,768,052. Application Ser. No. 11/289,262 in turn is a continuation of, and claims priority under 35 U.S.C. §120 from, nonprovisional U.S. patent application Ser. No. 09/351,544 entitled "Process To Improve High Performance Capacitor Properties In Integrated MOS Technologies," filed on Jul. 12, 1999, now U.S. Pat. No. 7,060,584. The subject matter of these patent documents is incorporated herein by reference.

TECHNICAL FIELD

This invention relates to the fabrication of semiconductor devices as it applies to integrated circuits, and more specifically, to methods for the fabrication of capacitors in such a process.

BACKGROUND

As the scale of integrated circuits has decreased, a number of new techniques have been introduced to the manufacturing process. One of these is the use of Anti-Reflective Layers (ARLs). These include both grown or deposited varieties, such as Titanium Nitride (TiN) or a Plasma Enhanced chemical vapor deposition Anti-Reflective Layer (PEARL), and coatings, such as an Anti-Reflective Coating (ARC).

The purpose of the ARL is to reduce net linewidth variations in the photolithographic process. Variations that are allowable within a 1 μm or even 0.6 μm process become unacceptable as devices move deeper into the submicron range. A variation of, for example, +0.1 μm or even ±0.15 μm in Critical Dimension (CD) may be tolerable at 1 μm, but would produce a factor of 2 or 3 difference between the upper and lower values at the 0.3 μm scale. Such variations in transistor gate length can undermine device performance and reliability, particularly on the low side. An ARL layer can readily reduce such variations in CD width by a third when compared to the same process without this layer.

The ARL is an additional step included as part of the photolithographic process. It is a highly absorbing film formed directly on the substrate and upon which the photoresist then is formed. The ARL absorbs most of the radiation that penetrates the resist, generally in the 70-85% range. Standing waves are thereby substantially reduced as there is less reflection off the substrate, and scattering from topological features is also suppressed. In addition, as an ARL partially planarizes the wafer topology, resist thickness is more uniform and linewidth variation over steps is improved.

This effect is shown in FIG. 1, where CD in units of μm is plotted against resist thickness in units of Angstroms. The shown data points are for a set of reference structures formed to measure variations in critical dimension. The lower line, with data points indicated by a series of xs, corresponds to a series of dense features without the use of an ARL. This curve is very sensitive to variations in resist thickness and shows a periodic structure due to standing waves.

The top three lines show the use of an ARL. The line formed on the solid squares corresponds to the same dense features as the non-ARL line of xs and may be compared directly. The ARL line varies in a much smoother fashion than the non-ARL curve and is therefore far less sensitive to processing variations. The line of open triangles, corresponding to isolated features with the same structure as solid squares, and the line of solid circles, corresponding to a different structure, also show the uniformity produced by using an anti-reflective layer.

As is often the case with process technology, the solution to one problem often creates a new problem, or, in this case, causes a latent problem to manifest itself. The particular problem here is the ability to integrate a high performance capacitor into a standard CMOS process flow, where capacitor performance is defined in terms of stability over a wide voltage range and low leakage levels.

A more or less standard embodiment of a portion of this process flow can be given by the following series of steps:

Standard Transistor Flow
1. Lower electrode deposition
2. Lower electrode doping
3. Lower electrode anneal Capacitor Process Module
4. Capacitor dielectric deposition
5. Upper electrode deposition
6. Upper electrode implant
7. Upper electrode anneal
8. Photo mask to define upper electrode
9. Upper electrode etch
10. Capacitor dielectric removal Standard Transistor Flow continued
11. ARL formation.
12. Photo mask to define lower electrode
13. Lower electrode etch
14. Poly oxidation for transistor and subsequent steps, where the subsequent steps would include the standard fabrication steps, such as masking and implantation to form the transistors' source and drain, as well as any common but optional steps, such as, say, the formation of a Lightly Doped Drain (LDD). Some of the steps on this list are themselves optional but common, such as the anneal of steps 3 and 7 or, what is more pertinent here, step 11.

This list of steps is broken into three parts. Steps 1-3 are common to both the formation of transistors for the device as well as the capacitors. If the capacitors were not needed, the process would proceed directly from step 3 to step 11 for the ARL to be applied and steps 4-10 eliminated. The inclusion of steps 4-10 allows the fabrication of a high-performance capacitor to be integrated into this standard CMOS process flow. In this way, these steps can be added as a group, or module, when the device being fabricated requires capacitors and otherwise deleted without changing the non-capacitor, transistor steps or flow. A variation could define and etch the lower electrode before the capacitor dielectric is formed, but it is preferred to integrate this with the etch of the standard transistor flow, particularly at 0.35 μm and below.

Step 4 forms a dielectric for the capacitors, such as an oxide, an Oxide-Nitride-Oxide (ONO) sandwich, oxynitride, or one of the other standard variations. Steps 5-9 form the upper electrodes, the lower electrodes having been formed, but not defined, at the same time as those for the transistors in steps 1-3. The capacitor dielectric remains at the end of step 9. This dielectric could be left at this stage and step 10 eliminated, its removal being incorporated into step 13 when the lower electrodes are etched. This modification would, however, require a revision of steps 12 and 13, as having this extra layer still on the substrate would change the reflectivity of the stack. The various settings for all the process parameters would then need to be recalibrated accordingly. Aside from the practical difficulties and complexities this modification would introduce, it would also mean that steps 4-10 were no longer an independent "module" that could be inserted or deleted depending on device requirements. For this reason, step 10 is included for ease of integration into the standard CMOS process.

Step 11 follows and is included for the reasons described earlier. It is an optional step and introduces an added layer of complexity to the process. For this reason it is normally omitted for device near or above the micron level, but is increasingly standard as devices move ever deeper into the submicron range.

The problem in this process as found in the prior art is in the juxtaposition of step 10 with step 11. It is this combination of the dielectric removal with the application of an anti-reflective layer having poor insulation properties that is detrimental to the capacitors.

This problem is that step 10 not only removes the unwanted capacitor dielectric, but will also undercut into the wanted portion below the upper electrode. This situation is shown in FIG. 3, which represents the process through step 10. This shows an undefined lower electrode layer 120 upon a field oxide or other underlying layers 130 included to isolate the lower electrode layer 120 electrically. An upper electrode 140 has been defined and etched, and is separated from the lower electrode layer 120 by a dielectric layer 160. Ideally, the dielectric layer 160 would have its sides even with those of the upper electrode. Instead, it suffers from the undercutting indicated at locations 180.

If processing were to continue as is common in a 1 μm or even 0.6 μm process, namely, without the ARL of step 11, this would not cause any major problems. In this case, steps 12 and 13 define and etch the lower electrode immediately after step 10, and are themselves followed by the formation of the transistor oxide in step 14. At this point, again with step 11 absent, this undercutting 180 will have been filled back in by a non-conductor such as borophosphosilicate glass (BPSG), a silicate glass, and degradation of the capacitors' dielectric will be minimal or non-existent.

This is demonstrated in FIGS. 10 and 11, where the solid diamonds represent this process without the ARL of step 11. FIG. 10 shows cumulative probability vs. capacitor leakage current at 5 volts, with the horizontal scale logarithmic in units of fA/μm$^2$. For the process without an anti-reflective layer, this is a nearly vertical line at a value of $10^{-1.5} \approx 0.03$ fA/μm$^2$. FIG. 11 is a plot of cumulative probability vs. capacitor voltage coefficient. This is a measure of capacitance as a function of the voltage across its plates. For an idealized conducting electrode capacitor, capacitance is independent of voltage, and the graph would be a vertical line at 0. For a capacitor formed on a semiconductor device, the plates of the capacitor are now of doped silicon or similar material and the deviation from this ideal is measured in PPM per volt. The line should still be as vertical as possible, for device consistency, and as close to zero as possible, for the best performance of the individual capacitors. The solid diamonds of the non-ARL process are again nearly vertical, and with a magnitude of just over 20 PPM/V, the negative values show how the coefficient is defined. This set of points, the solid diamonds, can be seen as reference values against which a fully integrated process can be measured.

With the inclusion of both steps 10 and 11, this undercutting is now filled in by the less benign ARL. In particular, PEARL is a silicon-rich $Si_xON_y$ film and is expected to be a poor insulator, resulting in high leakage currents. This will greatly degrade both device performance, due to leakage well beyond design specifications, and stability, as variations in performance will vary over a wide voltage range of values as the amount of undercutting 180 will vary from capacitor to capacitor. This is shown on FIGS. 10 and 11 by the solid squares. In FIG. 10, these points are well to the right of the reference values with leakage currents of, at best, several orders of magnitude higher. In FIG. 11, these points are far from vertical, showing a capacitance that is very voltage dependent due to excessive leakage.

Even when the undercutting, 180 of FIG. 3, is minimized or eliminated by using, for example, a dry etch in step 10, the combination of step 10 with step 11 can still cause capacitor degradation. Although the ARL no longer intrudes significantly into the inter-electrode region, its proximity still affects performance if the ARL is not sufficiently insulating, as is the case for PEARL.

Therefore, it is an objective of the present invention to integrate a high performance capacitor into a CMOS process flow, particularly where the flow incorporates an anti-reflective layer to reduce variations in critical dimension width.

SUMMARY

These and additional objects are accomplished by the various aspects of the present invention. A method is disclosed of fabricating a high performance capacitor that may be incorporated into a standard CMOS fabrication process suitable for submicron devices. The parameters used in the standard CMOS process may be maintained, particularly for defining and etching the lower electrode layer that also serves as the transistor gate. To reduce variation in critical dimension width, an Anti-Reflective Layer (ARL) is used. In the preferred embodiment, this is of the Plasma Enhanced chemical vapor deposition Anti-Reflective Layer (PEARL) type, although other Anti-Reflective Coatings (ARCS) or layers, such as a conductive film, such as titanium nitride (TIN), may be used. This ARL formation occurs after the capacitor specific process steps, but prior to the masking used for defining the lower electrodes.

In one embodiment, a Rapid Thermal Oxidation (RTO) is performed subsequent to removing the unwanted capacitor dielectric layer from the transistor poly outside of the capacitor regions, but prior to the PEARL deposition. This RTO is thin enough to not require a reformulation, due to changes in reflectivity, of the later process steps used in forming the transistors and other subsequent devices, yet thick enough to alleviate the degradation of capacitor performance due to the PEARL filling in any undercutting that occurred when the capacitor dielectric layer was removed. This is found to produce capacitors with low leakage and stability over a wide voltage range, with values comparable to those obtained with the PEARL absent.

Another embodiment instead eliminates the capacitor dielectric removal step. It is then replaced by a step to form an additional layer which, in a second step, is then etched away to leave spacers on the capacitor sides, thereby eliminating any undercutting of the dielectric. These new steps are both prior to the ARL formation and, as with the other embodiment, improve capacitor performance.

A further embodiment also eliminates the capacitor dielectric layer removal step prior to the ARL formation and forms the ARL on the dielectric and upper capacitor electrodes. The dielectric is then removed at the same time as the lower capacitor electrodes and transistor gates are formed.

Additional objects, advantages, and features of the present invention will become apparent from the following description of its preferred embodiments, which description should be taken in conjunction with the accompanying drawings. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

A primary objective of the present invention is to present a process for the integration of a high-performance capacitor into a standard CMOS fabrication process flow. In this context, high performance is defined to consist of low leakage levels and stability over a wide voltage range as would be required to achieve a 12-bit or higher analog-to-digital conversion capability. It is preferred that the steps required to form such a high-performance capacitor should not require any change in the process parameters for the non-capacitor stages. The preferred application of the described methods is in the submicron range, particularly on the order of 0.35 µm or below, where Anti-Reflective Layers (ARLs) are used to reduce variations in critical dimension width. The preferred ARLs are of the Plasma Enhanced chemical vapor deposition Anti-Reflective Layer (PEARL) variety, although others may be substituted, such as TiN. This invention is also applicable for any non-insulating and/or low strength dielectric layer placed on both electrodes of a capacitor after dielectric removal.

Figure 12:
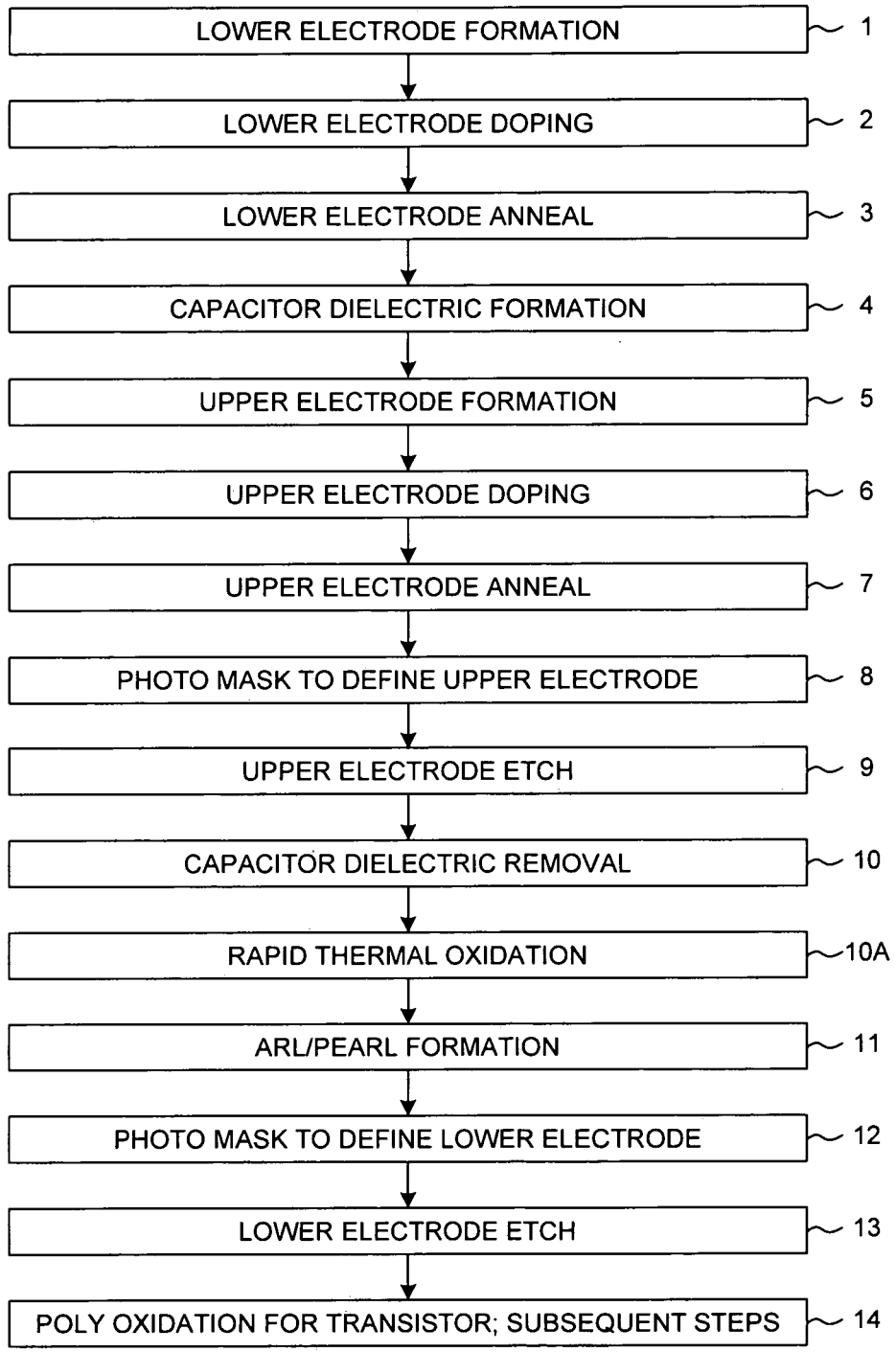
FIG. 12 is a flow chart of the embodiment of the present invention shown in FIGS. 2-5.

A preferred embodiment of the present invention is shown in FIG. 12 and given by the series of steps:

Standard Submicron Core Technology Flow
1. Lower electrode formation
2. Lower electrode doping
3. Lower electrode anneal Capacitor Process Module
4. Capacitor dielectric formation
5. Upper electrode formation
6. Upper electrode doping
7. Upper electrode anneal
8. Photo mask to define upper electrode
9. Upper electrode etch
10. Capacitor dielectric removal
10A. Rapid Thermal Oxidation Standard Submicron Core Technology Flow continued
11. ARL/PEARL formation
12. Photo mask to define lower electrode
13. Lower electrode etch
14. Poly oxidation for transistor and subsequent steps, where steps 9-11 are shown in FIGS. 2-5. Steps 1-3 and steps 11 on are part of the transistor fabrication process, while steps 4-10 Å are specific to capacitor formation. These steps differ from the more or less generic prior art by the inclusion of step 10A. The next few paragraphs describe the details of these steps according to this preferred embodiment.

Taking up the process at the formation of the lower electrodes, steps 1-3 are part of the standard transistor formation flow and are common for both the capacitors and later transistor formation steps. In step 1, the layer to serve as lower electrodes and the transistor gates is formed, preferably of amorphous silicon with a thickness of 2000 Å to 4000 Å. This layer is then doped in step 2, preferably implanted using phosphorus dose levels of from $5 \times 10^{15}$ cm$^{-2}$ to $2 \times 10^{16}$ cm$^{-2}$, although this could also be done in a non-implant method such as with POCl$_3$. This is followed by the optional but common step of an anneal, preferably by Rapid Thermal Processing (RTP), with a furnace anneal as another possibility.

At this stage, the steps specific to capacitor formation occur. A capacitor dielectric is formed in step 4, deposited or grown to a thickness in the range of 300 Å to 800 Å. Upon this dielectric the upper electrode is formed, doped, and annealed in steps 5-7. In the preferred embodiment, this is amorphous silicon with a thickness in the range of 1500 Å to 2500 Å, which has again been implanted by phosphorus, now with a dose in the $0.5$-$1.5 \times 10^{16}$ cm$^{-2}$ range, and subjected to an RTP anneal. Alternate embodiments could use other conductors such as TiN or tungsten for the electrode or, as with the lower electrode, other doping and annealing techniques. The upper electrode is then masked and etched in steps 9 and 10, leaving the structure shown in FIG. 2.

Figure 1:
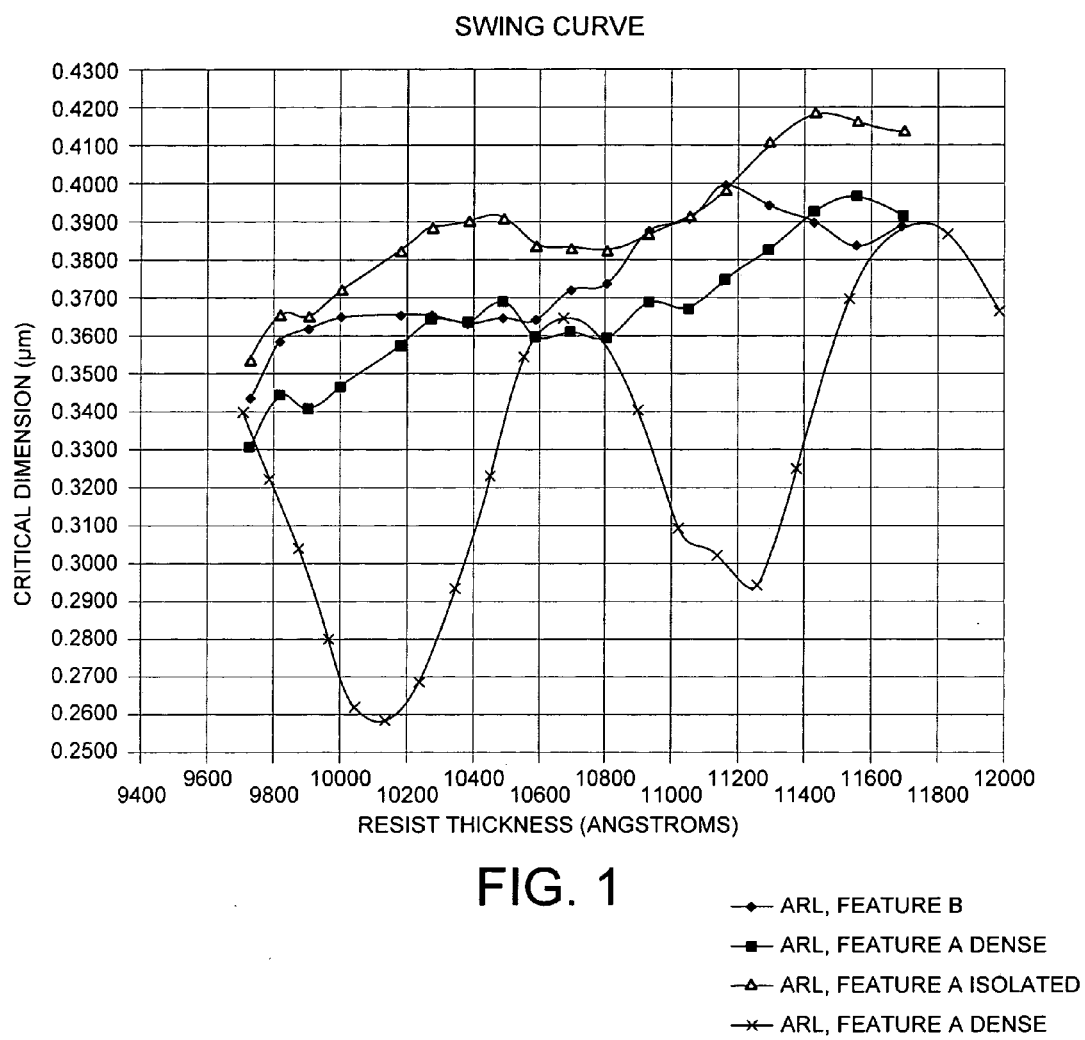
FIG. 1 shows variations in critical dimension versus resist thickness with and without an anti-reflective layer.
Figure 2:
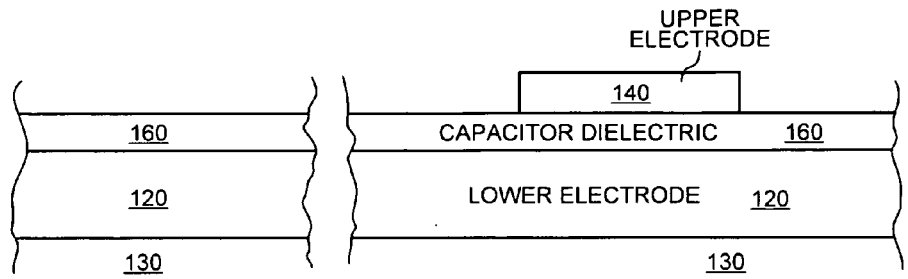
FIG. 2 shows an embodiment of the present invention at the stage where the upper electrode has been defined.

The right hand side of FIG. 2 corresponds to the capacitor sector and shows the defined upper electrode 140 on a capacitor dielectric 160, which is in turn on the lower electrode 120. The left hand side of FIG. 2, and FIGS. 3-9, correspond to the transistor sector of the device at the same stage as the capacitor sector on the right. At this stage the dielectric layer 160 has not been etched and the lower electrode is doped but undefined. The field oxide or other underlying layers 130 are included to electrically isolate the lower electrode/transistor gate layer 120.

Step 10 is the etch of the capacitor dielectric. In the preferred embodiment, this is a Buffered Oxide Etch (BOE), although other embodiments could employ a dry or other etch. Still another embodiment could completely dispense with this etch, but as discussed below, this would complicate the integration of the capacitor process steps into the larger process due to transistor gate length variation.

Figure 3:
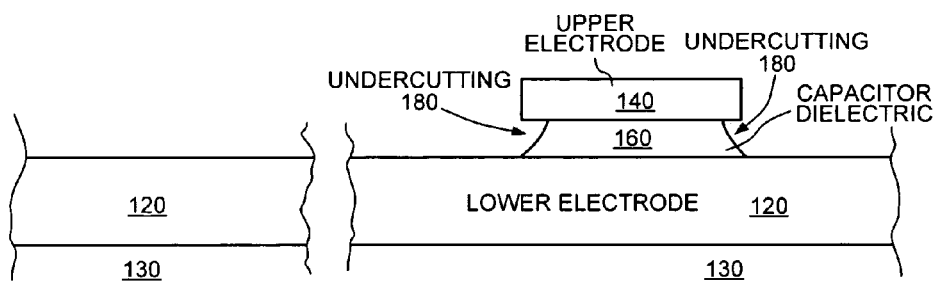
FIG. 3 shows the embodiment of FIG. 2 after the excess capacitor dielectric has been removed.

The result of this process is shown in FIG. 3. In this figure, the unwanted portions of the dielectric layer 160 have been removed in preparation for the PEARL deposition. An unwanted consequence of step 10 is that, as discussed in the background section, some of the wanted dielectric is also removed. This is the undercutting indicated in FIG. 3 at locations 180.

The preferred application of these embodiments is in a 0.35 µm mixed mode technology, where the specified length variation of the transistor gates formed from layer 120 in step 13, $\Delta L_{eff}$, is ±0.05 µm. The inclusion of the ARL allows for these tolerances, which otherwise would likely exceed ±0.15 µm. Since the PEARL is a silicon-rich $Si_xON_y$ film, it has poor insulating properties and needs to be kept from between the capacitor plates or from contacting both of them. The specified performance for the capacitors is less than 4 fA/µm² of leakage current and less than 50 PPM/V for the voltage coefficient suitable for the 14-bit analog resolution of the device employing this technique as the preferred embodiment. The inclusion of step 10 Å provides electrical insulation and makes this possible.

Another option would be to leave the entire capacitor dielectric layer 160 on the lower electrode and to deposit the PEARL or other ARL onto the capacitor dielectric rather than directly on the underlying layer 130. That is, this option eliminates step 10 and does not introduce step 10A. Steps 12 and 13 would then define and etch the dielectric along with the lower electrode. This process corresponds to the open squares of FIGS. 10 and 11 and, as discussed below, shows performance similar to when no PEARL layer is used. Thus, this option allows for the incorporation of a PEARL layer while maintaining capacitor performance. However, this would not allow the capacitor formation subprocess to be integrated into the fabrication process without a modification of process parameters and the consequent reformulation difficulties, as well as adding variation to the manufacturing steps required. For example, using the values of the preferred embodiment, the transistor gate photolithographic process would need to be optimized, as the preferred noncapacitor process PEARL thickness of approximately 375 Å is insufficient to achieve the preferred $L_{eff}$ variation with an dielectric layer of approximately 375 Å underneath. To match the described process of 375 Å PEARL with no dielectric would require something on the order of 800 Å PEARL if the 375 Å dielectric layer were left in place. Such reparameterizations result in other process difficulties that would require resolution and necessitate, two different process recipes, one for capacitors and one without capacitors.

Figure 4:
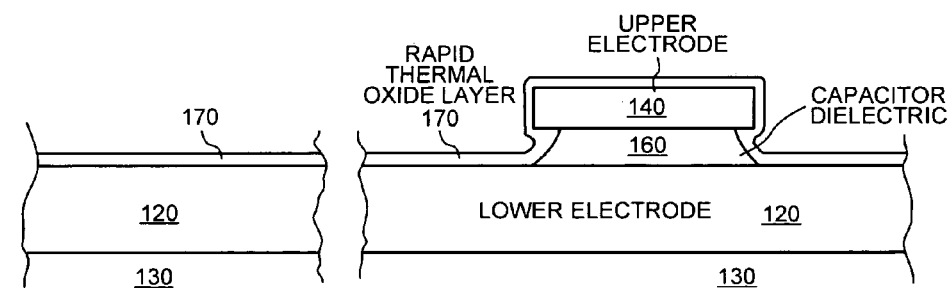
FIG. 4 shows the embodiment of FIG. 2 after forming a thin insulating layer.

Returning to the process flow of the preferred embodiment, in step 10 Å the structure of FIG. 3 is subjected to a Rapid Thermal Oxidation (RTO). This involves a short oxidation in an RTO tool to grow to a layer of oxide, preferably 20 Å to 60 Å thick, although this could be increased to 70 Å or 100 Å if the extra thickness did not produce excessive degradation of the photolithographic process. This is performed for 10 s to 60 s at a temperature of from 850° C. to 1050° C., with values in the lower part of the range preferred for minimal impact on transistor performance. The result is shown in FIG. 4, where the rapid thermal oxide layer 170 has sealed in the previous structure by filling in the undercut between the capacitor plates 140 and 120. The RTO layer 170 is left on the lower electrode during the PEARL deposition. The chosen thickness for the RTO layer 170 is a compromise: It needs to be thick enough to fill in the undercut 180, yet thin enough not significantly to degrade a photolithographic process, particularly in the transistor sector, based on previously determined parameters. At 20 Å to 60 Å, this is roughly an order of magnitude thinner than removed capacitor dielectric 160 and the original setting may still be successfully employed. In other embodiments, this oxide or other dielectric could be formed in a furnace or possibly even deposited with an optional anneal.

Figure 5:
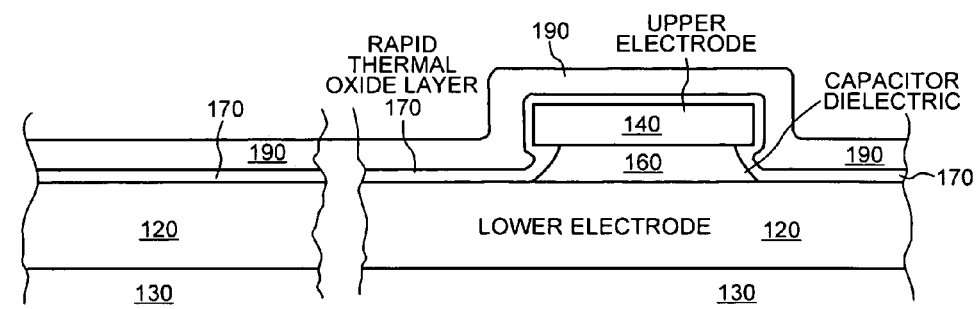
FIG. 5 is a later stage of the embodiment of FIG. 2, where an ARL has been applied.

FIG. 5 shows the PEARL 190 as deposited in step 11. In the preferred embodiment this layer is 300 Å to 400 Å. At this stage, the standard transistor process flow continues, with steps 12 and 13 defining and etching the lower electrodes, including those of the capacitors as well as the transistor gates.

An alternate embodiment is shown in FIGS. 6-9 and follows the following series of steps:
Standard Submicron Core Technology Flow
1. Lower electrode formation
2. Lower electrode doping
3. Lower electrode anneal
Capacitor Process Module
4. Capacitor dielectric formation
5. Upper electrode formation
6. Upper electrode doping
7. Upper electrode anneal
8. Photo mask to define upper electrode
9. Upper electrode etch
(delete 10. Capacitor oxide removal)
10'. Spacer oxide deposition or growth
10". Capacitor dielectric and spacer etch
Standard Submicron Core Technology Flow continued
11. ARL/PEARL formation
12. Photo mask to define lower electrode
13. Lower electrode etch
14. Poly oxidation for transistor and subsequent steps Steps 1-9 of this embodiment are the same as in the previously described embodiment. The preferred values of the parameters are also the same. This is also true from step 11 onward. The difference is in the deletion of step 10 and, instead of including step 10A, the inclusion of steps 10' and 10".

The purpose and effect of steps 10' and 10" is the same as step 10A above, namely further to remove the poorly insulating ARL from the interelectrode region of the capacitor. In this alternate embodiment, this is done by preventing this gap from forming, while in the previous embodiment this gap was allowed to form, but subsequently refilled and the PEARL was then electrically isolated.

Figure 6:
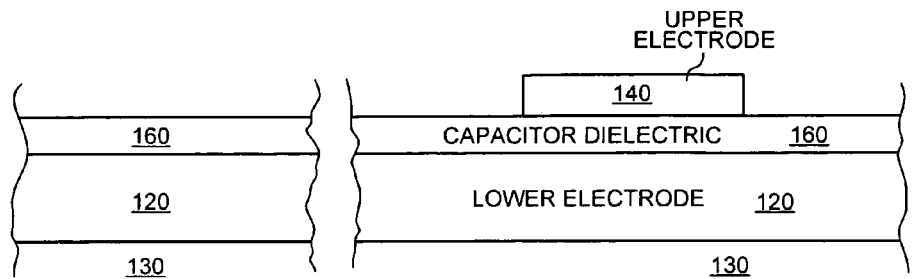
FIG. 6 is the same as FIG. 2, but as the precursor to an alternate embodiment.
Figure 7:
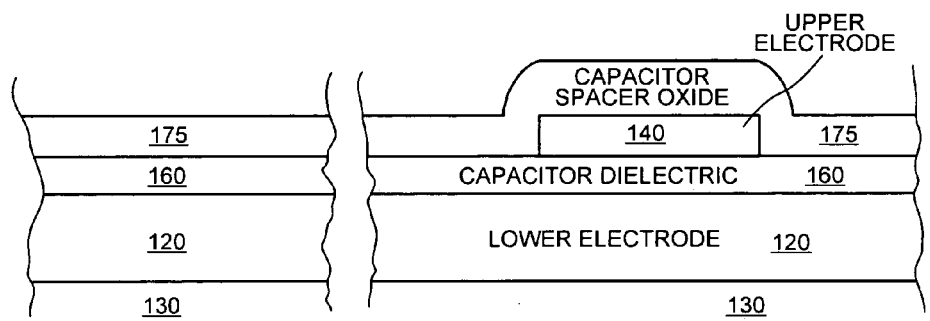
FIG. 7 shows the alternate embodiment after a capacitor spacer layer has been formed.

FIG. 6 shows the situation at the end of step 9 and is therefore the same as FIG. 2. In step 10' a capacitor spacer insulating layer 175 is formed on this structure as shown in FIG. 7. This insulating layer is preferably oxide and may be grown or, preferably, deposited to a thickness of 500 Å to 2000 Å in the preferred embodiment of this variation.

Figure 8:
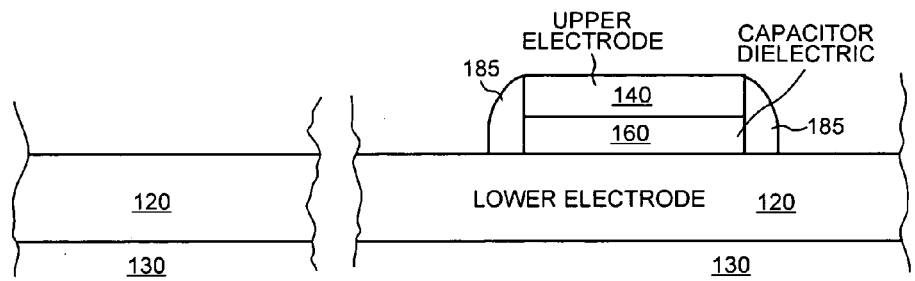
FIG. 8 is FIG. 7 subsequent to etching.

In step 10", both this spacer oxide 175 and the original capacitor dielectric 160 are etched back to the lower electrode 120. The resultant structure is shown in FIG. 8. Instead of the undercutting 180 found in FIG. 3, a spacer 185, preferably with a thickness of 500 Å to 2000 Å, now remains on either side of the capacitor. This is composed of the combination of the oxide layer 175 and dielectric layer 160. In this manner, the interpoly portions of dielectric 160 is protected so that the PEARL may not infiltrate into this region while at the same time the dielectric layers 175 and 160 are no longer in the transistor sector.

Figure 9:
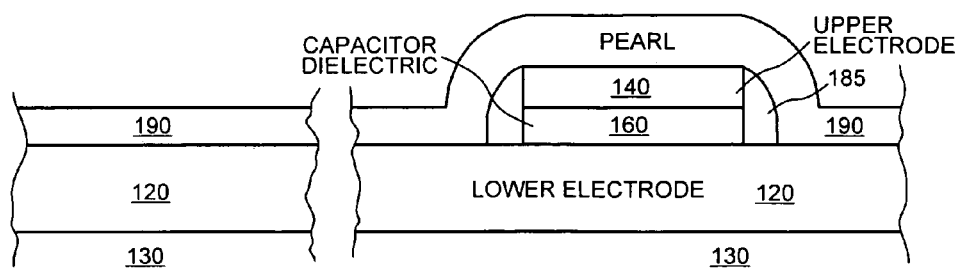
FIG. 9 is the alternate embodiment after an ARL has been applied.
Figure 10:
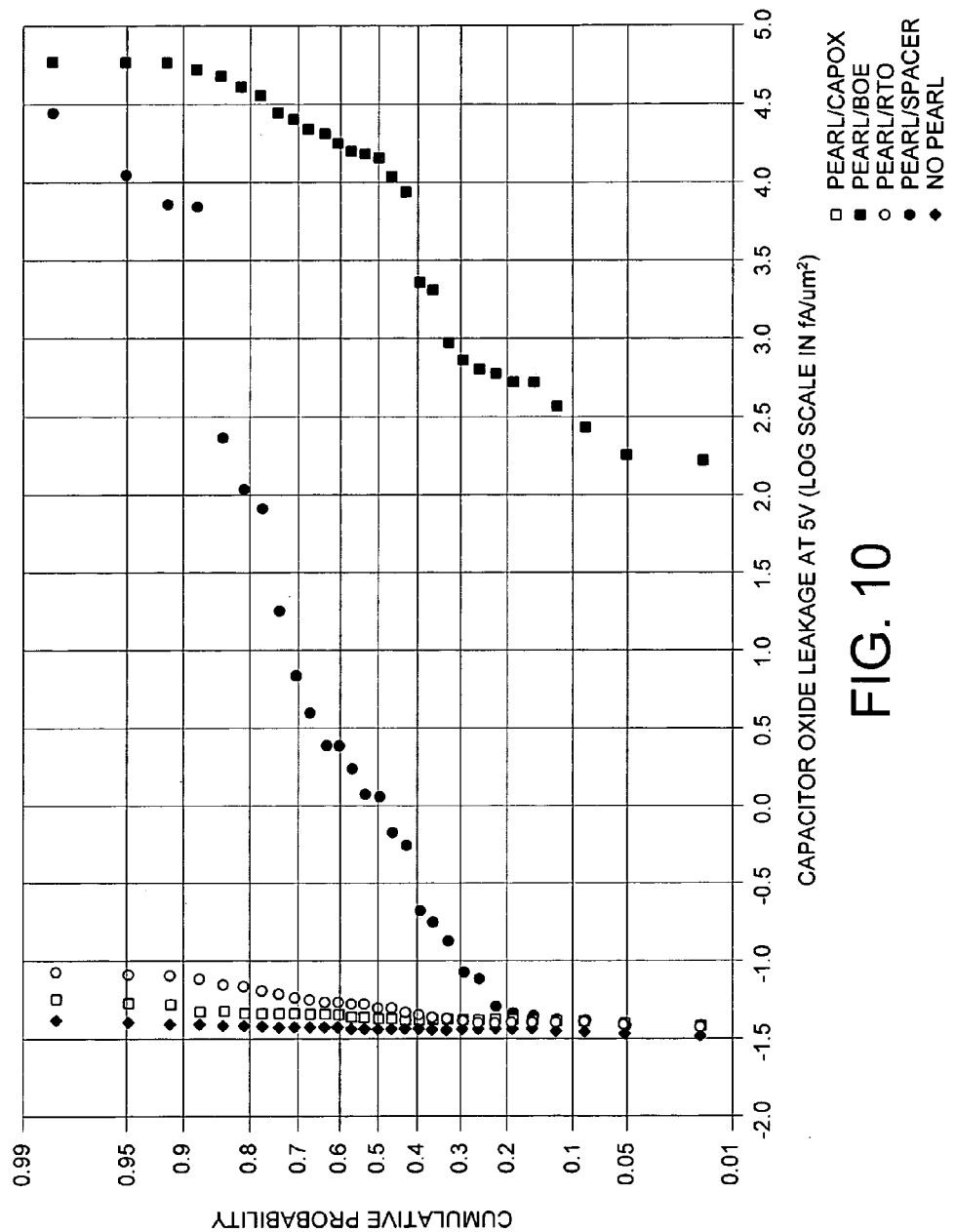
FIG. 10 shows a cumulative probability plot versus capacitor leakage of different embodiments.
Figure 11:
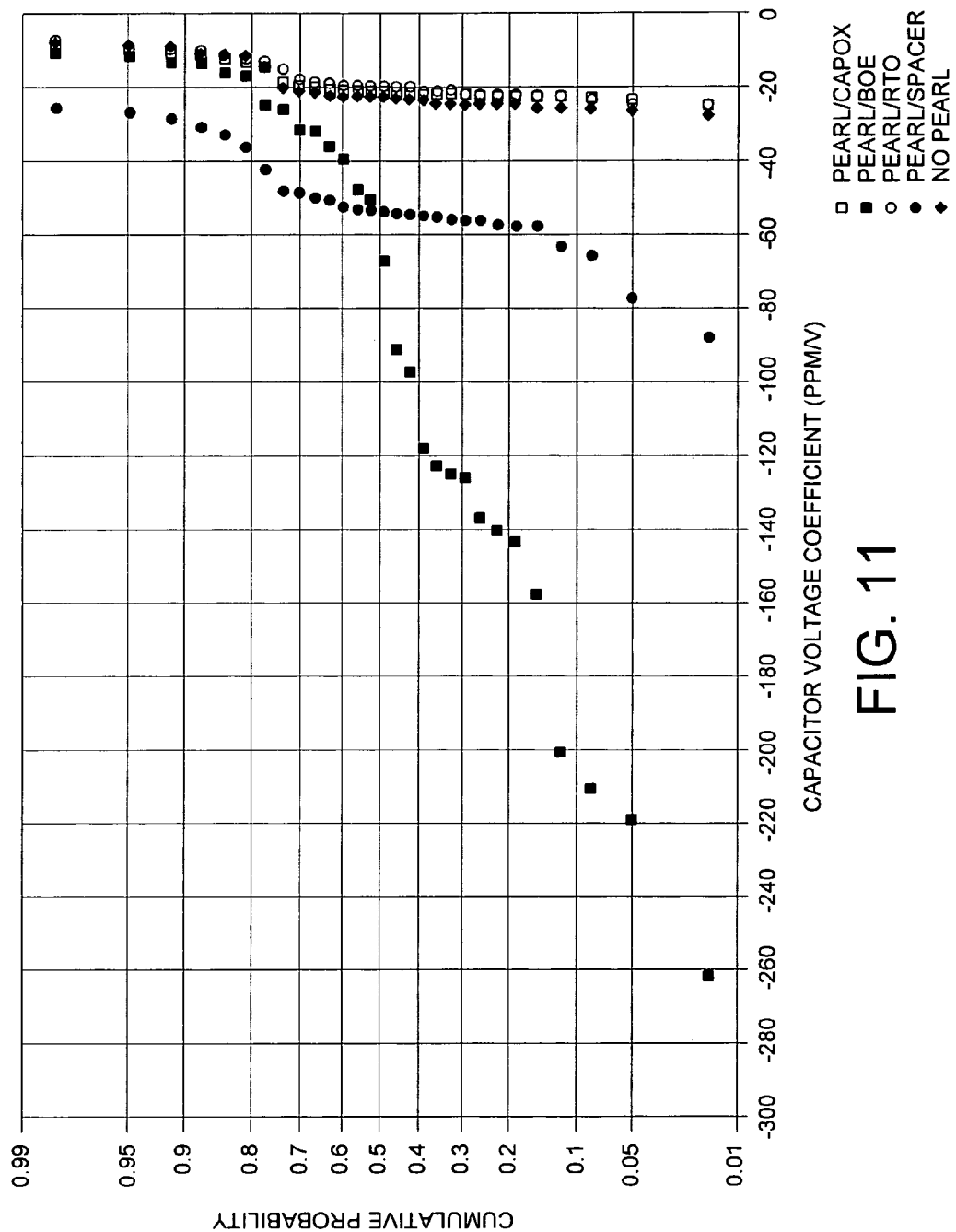
FIG. 11 shows a cumulative probability plot versus the capacitor voltage coefficient of different embodiments.

FIG. 9 shows the result of step 11 in this embodiment after the PEARL deposition. The remaining process steps are now the same as in the previously described embodiment or, equivalently at this stage, the standard noncapacitor flow. Either of these embodiments substantially improves the performance of the capacitors, as shown in FIGS. 10 and 11. FIG. 10 shows cumulative probability vs. capacitor dielectric leakage current at 5 volts, where the horizontal scale is logarithmic in units of fA/µm². FIG. 11 is a plot of cumulative probability vs. capacitor voltage coefficient PPM/volt. The graph has five series of points: the circles correspond to the described embodiments, the open circle the preferred embodiment using the RTO process of step 10A and the solid circle the alternative embodiment with the spacer of steps 10' and 10".

As described in the background section, the solid squares correspond to the prior art, while the solid diamonds are for reference and correspond to the desired result. The solid diamonds correspond to the process through step 10 and show leakage levels after the capacitor has been etched but before the problematical PEARL layer is applied. The solid diamonds form a near vertical line at a value of approximately $10^{-1.5} \approx 0.03$ fA/µm², well below the design objective. As discussed in the background section, this process is not preferred since the PEARL layer used in the deep submicron region is lacking. The values for the prior art (solid squares) lie well to the right of these reference values. This is a consequence of the degradation of the interpoly dielectric from the PEARL. Even when undercutting of the capacitor dielectric, indicated at 180 in FIG. 3, is small, if the ARL has poor insulating properties, such as for the preferred PEARL layer, leakage between upper and lower electrodes can occur. The preferred embodiment (open circles) differs very little from the reference values, producing quite vertical lines at nearly the same values in both FIGS. 10 and 11. The alternative embodiment's values (closed circles) do not coincide as well, but still show improvement compared to the prior art.

The open squares show the process omitting step 10 and removing the dielectric as part of the lower electrode etch. This alternative embodiment mentioned above corresponds to leaving the capacitor dielectric on the lower electrode and to depositing the ARL onto the dielectric rather than directly on the underlying layer. The results for this method are very close to those where the ARL is missing, with the points of the open squares nearly coinciding with those of the solid diamonds. Thus, one way to still maintain capacitor performance would be to omit step 10 without including any additional steps. However, as discussed above, this option would not allow the capacitor formation subprocess to be integrated into the fabrication process without a modification of process parameters and the consequent reformulation difficulties, as well as adding variation to the manufacturing steps required. The capacitor process module of steps 4-10 could no longer be included or excluded as needed without also altering the other portions of the process, particularly steps 11, 12, and 13 which immediately follow. However, for applications that do not require the capacitor formation process to be integrated into a CMOS process, or that would allow the initial parameter formulation based upon it, this alternative embodiment would then become the preferred embodiment.

Finally, it should be noted that although this discussion has been in terms of an integrated capacitor/CMOS process flow using ARLs, the invention is of wider applicability. The focus here has been on ARLs due to their increasing importance, but a process using another poorly insulating layer at the corresponding process step would similarly benefit. Similarly, whether involving an ARL or other non-insulator, these techniques could improve capacitor production even when not integrated into a CMOS process, particularly those of the embodiment of the previous paragraph.

Various details of the implementation and method are merely illustrative of the invention. It will be understood that various changes in such details may be within the scope of the invention, which is to be limited only by the appended claims. Accordingly, various modifications, adaptations, and combinations of various features of the described embodiments can be practiced without departing from the scope of the invention as set forth in the claims.

What is claimed is:

1. A method of manufacturing a capacitor, comprising:
   (a) forming a lower electrode layer;
   (b) forming a dielectric layer over the lower electrode layer;
   (c) forming an upper electrode layer over the dielectric layer;
   (d) forming an upper electrode of the capacitor by removing a portion of the upper electrode layer, wherein an inter-electrode region is disposed within a lateral boundary of the upper electrode and between the lower electrode layer and the upper electrode, and wherein a portion of the dielectric layer is disposed in the inter-electrode region;
   (e) exposing a portion of the lower electrode layer by removing a portion of the dielectric layer, wherein a portion of the dielectric layer is removed from the inter-electrode region;
   (f) forming a conformal insulating layer over the exposed portion of the lower electrode layer beside the portion of the dielectric layer disposed in the inter-electrode region, wherein a portion of the conformal insulating layer is formed in the inter-electrode region; and
   (g) forming an absorbing film over the conformal insulating layer.

2. The method of claim 1, further comprising:
   (h) forming a photoresist mask over the absorbing film.

3. The method of claim 1, further comprising:
   (h) forming a lower electrode of the capacitor by removing a portion of the lower electrode layer defined by a photoresist mask, wherein the absorbing film absorbs radiation that penetrates the photoresist mask.

4. The method of claim 1, further comprising:
   (h) forming a layer of photoresist upon the absorbing film, wherein the absorbing film absorbs radiation that penetrates the layer of photoresist.

5. The method of claim 1, wherein the absorbing film is an anti-reflective layer.

6. The method of claim 1, wherein the forming the upper electrode of the capacitor by removing the portion of the upper electrode layer involves exposing a portion of the dielectric layer, and wherein the exposing the portion of the lower electrode layer involves removing a portion of the exposed portion of the dielectric layer.

7. The method of claim 1, wherein the conformal insulating layer is an oxide layer formed in a thermal process.

8. The method of claim 1, wherein the absorbing film is titanium nitride (TiN).

9. A method of manufacturing a capacitor, comprising:
   (a) forming an upper electrode layer over a capacitor dielectric layer, wherein the capacitor dielectric layer is disposed between the upper electrode layer and a lower electrode layer;
   (b) removing a portion of the upper electrode layer such that an upper electrode of the capacitor is formed having an edge;

(c) removing a portion of the dielectric layer such that an undercutting is formed underneath the edge of the upper electrode, wherein the dielectric layer is absent from the undercutting;
(d) forming a conformal insulating layer over the upper electrode such that a portion of the undercutting is filled in by the conformal insulating layer; and
(e) forming an absorbing film over the conformal insulating layer.

10. The method of claim 9, further comprising:
(f) forming a photoresist mask over a portion of the absorbing film; and
(g) irradiating the photoresist mask with radiation that penetrates the photoresist mask, wherein the absorbing film reduces a reflection of the radiation by 70% or more.

11. The method of claim 9, further comprising:
(f) forming a lower electrode of the capacitor by removing a portion of the lower electrode layer defined by a photoresist mask, wherein the absorbing film absorbs radiation that penetrates the photoresist mask.

12. The method of claim 9, wherein the absorbing film is an anti-reflective layer.

13. The method of claim 9, wherein the capacitor dielectric layer has a thickness ranging from 300 angstroms to 800 angstroms.

14. The method of claim 9, further comprising:
(f) forming the lower electrode layer upon an underlying layer of a semiconductor device that electrically isolates the lower electrode layer.

15. The method of claim 9, wherein the conformal insulating layer has a thickness ranging from 20 angstroms to 100 angstroms.

16. The method of claim 9, wherein the conformal insulating layer is formed using a rapid thermal oxidation (RTO) process to grow a layer of silicon oxide to a thickness ranging from 20 angstroms to 100 angstroms.

17. The method of claim 9, wherein the absorbing film is a plasma enhanced chemical vapor deposition anti-reflective layer (PEARL).

* * * * *